United States Patent
Jing et al.

(10) Patent No.: US 11,758,747 B2
(45) Date of Patent: Sep. 12, 2023

(54) LIGHT EMITTING DEVICE AND MANUFACTURING METHOD THEREOF AND DISPLAY PANEL

(71) Applicant: BOE TECHNOLOGY GROUP CO., LTD., Beijing (CN)

(72) Inventors: Shu Jing, Beijing (CN); Xiaobo Du, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 189 days.

(21) Appl. No.: 17/412,460

(22) Filed: Aug. 26, 2021

(65) Prior Publication Data

US 2022/0069247 A1 Mar. 3, 2022

(30) Foreign Application Priority Data

Sep. 2, 2020 (CN) .......... 202010911623.X

(51) Int. Cl.
| | |
|---|---|
| *H01L 51/50* | (2006.01) |
| *H10K 50/13* | (2023.01) |
| *H10K 50/19* | (2023.01) |
| *H10K 71/00* | (2023.01) |
| *H10K 85/60* | (2023.01) |
| *H10K 101/30* | (2023.01) |
| *H10K 102/00* | (2023.01) |

(52) U.S. Cl.
CPC .......... *H10K 50/131* (2023.02); *H10K 50/19* (2023.02); *H10K 71/00* (2023.02); *H10K 85/60* (2023.02); *H10K 85/626* (2023.02); *H10K 85/631* (2023.02); *H10K 85/633* (2023.02); *H10K 85/6572* (2023.02); *H10K 2101/30* (2023.02); *H10K 2102/351* (2023.02); *H10K 2102/361* (2023.02)

(58) Field of Classification Search
CPC .... H10K 85/60; H10K 85/626; H10K 85/631; H10K 85/633; H10K 2101/30
See application file for complete search history.

(56) References Cited

U.S. PATENT DOCUMENTS

2020/0295292 A1* 9/2020 Kim ................. H10K 50/19

* cited by examiner

*Primary Examiner* — Anthony Ho
(74) *Attorney, Agent, or Firm* — Houtteman Law LLC

(57) ABSTRACT

The present disclosure provides a light emitting device including: a first electrode; a first light emitting layer on a side of the first electrode; an N-type charge generation layer on a side of the first light emitting layer distal to the first electrode; a P-type charge generation layer on a side of the N-type charge generation layer distal to the first light emitting layer; a second light emitting layer on a side of the P-type charge generation layer distal to the N-type charge generation layer; and a second electrode on a side of the second light emitting layer distal to the P-type charge generation layer. The N-type charge generation layer includes a host material which has a lowest unoccupied molecular orbital energy level less than or equal to −2.9 and a glass transition temperature greater than 130° C.

20 Claims, 3 Drawing Sheets

LIGHT EMITTING DEVICE AND MANUFACTURING METHOD THEREOF AND DISPLAY PANEL

CROSS-REFERENCE TO RELATED APPLICATIONS

The present application claims the priority of the Chinese Patent Application No. 202010911623.X, filed on Sep. 2, 2020, the content of which is incorporated herein by reference in its entirety.

TECHNICAL FIELD

The present disclosure relates to the field of display technology, and in particular relates to a light emitting device and a manufacturing method thereof, and a display panel.

BACKGROUND

Organic electroluminescent devices (OLEDs) have a series of advantages such as all-solid-state, white light emission, fast response, wide viewing angle, wide working temperature range, and have attracted more and more attention from academia and industry. After years of continuous active exploration and further optimization of a structure of the devices, processes and related materials, organic electroluminescence has greatly been improved and has now achieved industrialization.

SUMMARY

According to one aspect of the present disclosure, a light emitting device is provided. The light emitting device includes: a first electrode; a first light emitting layer on a side of the first electrode; an N-type charge generation layer on a side of the first light emitting layer distal to the first electrode; a P-type charge generation layer on a side of the N-type charge generation layer distal to the first light emitting layer; a second light emitting layer on a side of the P-type charge generation layer distal to the N-type charge generation layer; and a second electrode on a side of the second light emitting layer distal to the P-type charge generation layer, wherein the N-type charge generation layer includes a host material, and the host material of the N-type charge generation layer has a lowest unoccupied molecular orbital energy level less than or equal to −2.9 and a glass transition temperature greater than 130° C.

In some embodiments, the host material of the N-type charge generation layer includes an electron transport material having the following general formula:

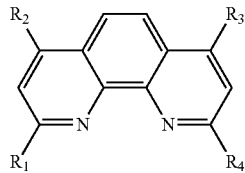

where R1, R2, R3 and R4 are respectively and independently selected from any one of hydrogen, fluorine, chlorine, bromine, alkyl, aryl, heteroalkyl or heteroaryl.

In some embodiments, the N-type charge generation layer further includes a guest material, and the guest material of the N-type charge generation layer includes an N-type doped material.

In some embodiments, the N-type doped material includes any one of ytterbium, cesium, or lithium.

In some embodiments, a volume doped concentration of the guest material of the N-type charge generation layer is in a range from 0.8% to 1.2%.

In some embodiments, the volume doped concentration of the guest material of the N-type charge generation layer is 1%.

In some embodiments, the N-type charge generation layer has a thickness in a range from 100 angstroms to 250 angstroms in a direction perpendicular to the first electrode.

In some embodiments, the P-type charge generation layer includes a host material and a guest material, and the host material of the P-type charge generation layer is selected from any one of hole transport materials of triphenylamines and biphenylamines.

In some embodiments, the guest material of the P-type charge generation layer includes a P-type doped material.

In some embodiments, the P-type doped material is any one selected from a radialene compound, tetracyanodimethyl-p-benzoquinone, and tetracyanoquinodimethane which have the following general formula:

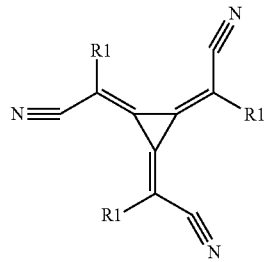

where R1 is selected from any one of aryl and heteroaryl.

In some embodiments, a volume doped concentration of the P-type doped material is less than or equal to 5%.

In some embodiments, the P-type charge generation layer has a thickness in a range from 50 angstroms to 120 angstroms in the direction perpendicular to the first electrode.

In some embodiments, a color of light emitted by the first light emitting layer is the same as or different from a color of light emitted by the second light emitting layer.

In some embodiments, the light emitting device further includes the following layers which are sequentially provided in a direction away from the first electrode: a hole injection layer on a side of the first electrode; a first hole transport layer on a side of the hole injection layer distal to the first electrode; a first electron blocking layer on a side of the first hole transport layer distal to the first hole injecting layer, and the first light emitting layer being on a side of the first electron blocking layer distal to the first hole transport layer; and a first hole blocking layer on a side of the first light emitting layer distal to the first electron blocking layer, and the N-type charge generation layer being on a side of the first hole blocking layer distal to the first light emitting layer.

In some embodiments, the light emitting device further includes the following layers which are sequentially provided in a direction away from the P-type charge generation layer: a second hole transport layer on a side of the P-type charge generation layer distal to the N-type charge generation layer; a second electron blocking layer on a side of the second hole transport layer distal to the P-type charge generation layer, and the second light emitting layer being on a side of the second electron blocking layer distal to the second hole transport layer; a second hole blocking layer on a side of the second light emitting layer distal to the second electron blocking layer; a electron transport layer on a side of the second hole blocking layer distal to the second light emitting layer; and an electron injection layer on a side of the electron transport layer distal to the second hole blocking layer.

According to another aspect of the present disclosure, a display panel is further provided. The display panel includes the above light emitting device and a driving circuit for driving the light emitting device.

According to another aspect of the present disclosure, a method of manufacturing the light emitting device is further provided. The method includes: providing a base substrate, and forming a first electrode on the base substrate; forming a first light emitting layer on a side of the first electrode distal to the base substrate; forming an N-type charge generation layer on a side of the first light emitting layer distal to the first electrode, such that a host material of the N-type charge generation layer has a lowest unoccupied molecular orbital energy level less than or equal to −2.9 and a glass transition temperature greater than 130° C.; forming a P-type charge generation layer on a side of the N-type charge generation layer distal to the first light emitting layer; forming a second light emitting layer on a side of the P-type charge generation layer distal to the N-type charge generation layer; and forming a second electrode on a side of the second light emitting layer distal to the P-type charge generation layer.

In some embodiments, the host material of the N-type charge generation layer includes an electron transport material having the following general formula:

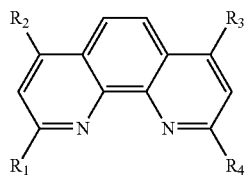

where R1, R2, R3 and R4 are respectively and independently selected from any one of hydrogen, fluorine, chlorine, bromine, alkyl, aryl, heteroalkyl or heteroaryl.

In some embodiments, the N-type charge generation layer further includes a guest material, the guest material of the N-type charge generation layer includes an N-type doped material, and the N-type doped material includes any one of ytterbium, cesium, or lithium.

In some embodiments, the guest material of the N-type charge generating layer has a volume doped concentration in a range from 0.8% to 1.2%.

BRIEF DESCRIPTION OF THE DRAWINGS

In order to more clearly illustrate the technical solutions of the embodiments of the present disclosure, the drawings used in the embodiments or the related technical descriptions will be briefly introduced below, and it is obvious that the drawings in the following description only relate to some embodiments of the present disclosure and are not intended to limit the present disclosure.

DETAILED DESCRIPTION

To make the objects, technical solutions and advantages of the embodiments of the present disclosure more apparent, the technical solutions of the embodiments of the present disclosure will be clearly and completely described below with reference to the drawings of the embodiments of the present disclosure.

Figure 1:
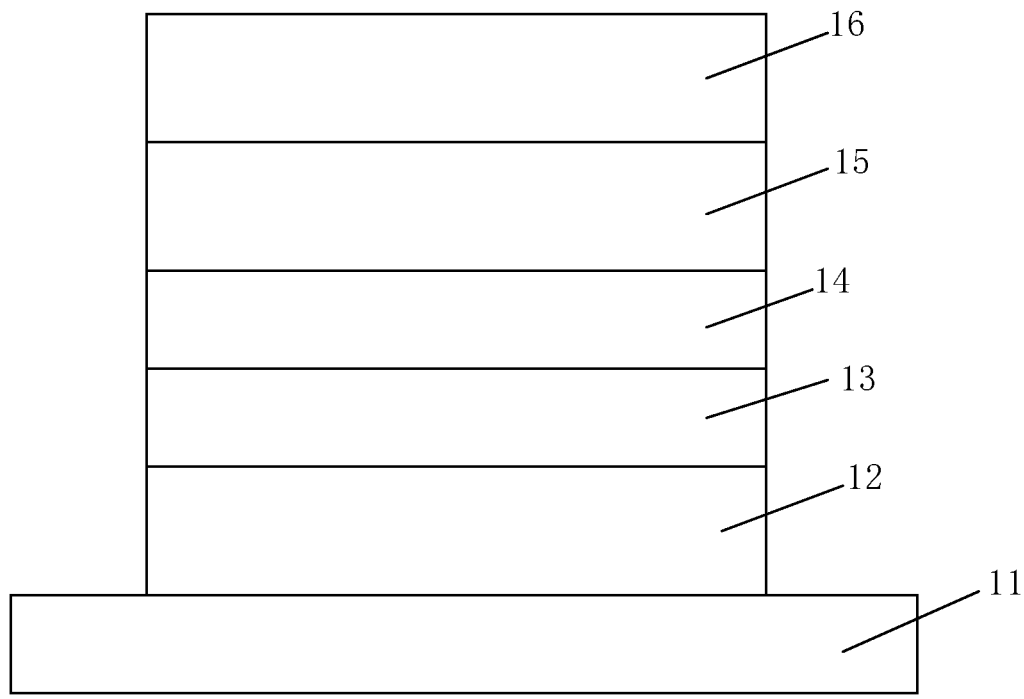
FIG. 1 is a schematic view illustrating a structure of a light emitting device according to an embodiment of the present disclosure.

The present disclosure provides a light emitting device, and FIG. 1 is a schematic view illustrating a structure of a light emitting device according to an embodiment of the present disclosure. As shown in FIG. 1, the light emitting device includes: a first electrode 11, a first light emitting layer 12, an N-CGL layer (N-type charge generation layer) 13, a P-CGL layer (P-type charge generation layer) 14, a second light emitting layer 15, and a second electrode 16. The first light emitting layer 12 is on a side of the first electrode 11. The N-CGL layer 13 is on a side of the first light emitting layer 12 distal to the first electrode 11. The P-CGL layer 14 is on a side of the N-CGL layer 13 distal to the first light emitting layer 12. The second light emitting layer 15 is on a side of the P-CGL layer 14 distal to the N-CGL layer 13. The second electrode 16 is on a side of the second light emitting layer 15 distal to the P-CGL layer 14. In the present disclosure, a material of the N-CGL layer 13 includes a host material and a guest material. The host material of the N-CGL layer has a lowest unoccupied molecular orbital (LUMO) energy level less than or equal to −2.9 and a glass transition temperature greater than 130° C. The above structure can improve the energy level balance between the N-CGL layer and the P-CGL layer, and effectively improve the high temperature reliability of the laminated light emitting device.

As shown in FIG. 1, the light emitting device may be a laminated organic electroluminescent display device (i.e., an organic electroluminescent display device with stacked layers). The first electrode 11 may be an anode of the laminated organic electroluminescent display device, and the second electrode 16 may be a cathode of the laminated organic electroluminescent display device. The light emitting device may further include, for example, a hole injection layer, a hole transport layer, an electron transport layer, an electron injection layer, and the like sequentially stacked. The hole transport layer is proximal to the anode of the organic electroluminescent display device, and the electron transport layer is proximal to the cathode of the organic electroluminescent display device. The first light emitting layer 12 and the second light emitting layer 15 are between the hole transport layer and the electron transport layer.

Optionally, the first light emitting layer 12 emits light of the same color as the second light emitting layer 15, or the first light emitting layer 12 emits light different from the color of the second light emitting layer 15.

Figure 4:
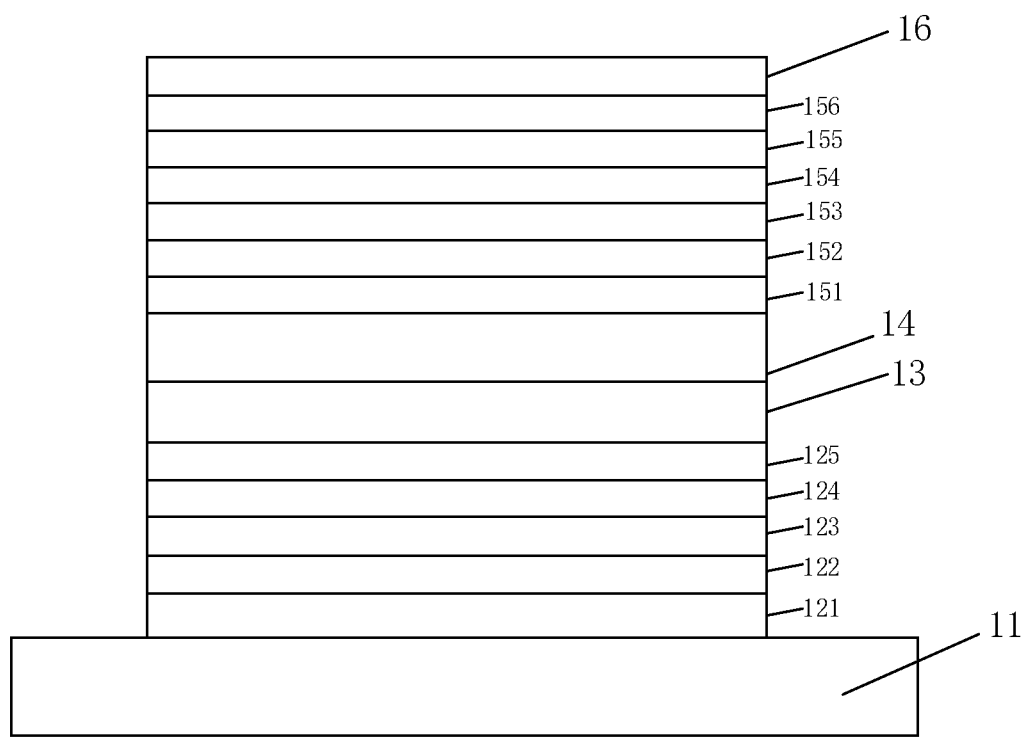
FIG. 4 is a schematic view illustrating a structure of a light emitting device according to an embodiment of the present disclosure.

Optionally, as shown in FIG. 4, the light emitting device further includes a hole injection layer 121 on a side of the first electrode 11, a first hole transport layer 122 on a side of the hole injection layer 121 distal to the first electrode 11, a first electron blocking layer 123 on a side of the first hole transport layer 122 distal to the first hole injection layer 121, a first light emitting layer 124 being on a side of the first electron blocking layer 123 distal to the first hole transport layer 122, and a first hole blocking layer 125 on a side of the first light emitting layer 124 distal to the first electron blocking layer 123, which are sequentially provided along a direction away from the first electrode.

Optionally, as shown in FIG. 4, the light emitting device further includes a second hole transport layer 151 on a side of the P-CGL layer distal to the N-CGL layer, a second electron blocking layer 152 on a side of the second hole transport layer 151 distal to the P-CGL layer, a second light emitting layer 153 being on a side of the second electron blocking layer 152 distal to the second hole transport layer 151, a second hole blocking layer 154 on a side of the second light emitting layer 153 distal to the second electron blocking layer 152, an electron transport layer 155 on a side of the second hole blocking layer 154 distal to the second light emitting layer 153, and an electron injection layer 156 on a side of the electron transport layer 155 distal to the second hole blocking layer 152, which are sequentially provided along the direction away from the first electrode.

Optionally, the guest material of the N-CGL layer may include an N-type doped material. The N-type doped material may be an implanting metal material, such as Yb (ytterbium), and the N-type doped material may be other metals or metal compounds, such as Cs (cesium), Li (lithium), or the like. And, optionally, the guest material of the N-CGL layer has a volume doped concentration in a range from 0.8% to 1.2%. In one particular example, the guest material has a volume doped concentration of 1%. A thickness of the N-CGL layer in a direction perpendicular to the first electrode 11 is in a range from 100 angstroms to 250 angstroms. The thickness herein denotes a dimension in a direction perpendicular to the first electrode or the second electrode.

Optionally, the host material of the N-CGL layer may include an electron transport material selected from a group consisting of the following general formulas:

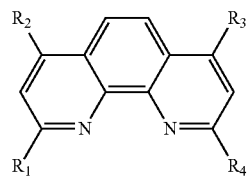

Where $R_1$, $R_2$, $R_3$, and $R_4$ are substituents, and the substituents may be respectively and independently selected from any one of hydrogen (H), fluorine (F), chlorine (Cl), bromine (Br), alkyl, aryl, heteroalkyl and heteroaryl. A selective example of the host material of the N-CGL layer is selected from the following:

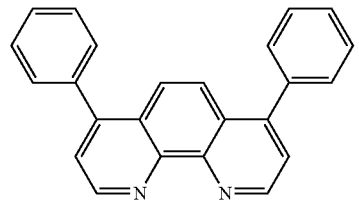
A

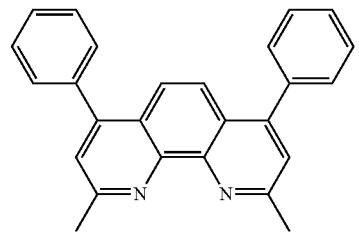
B

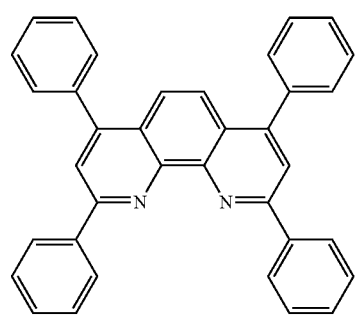
C

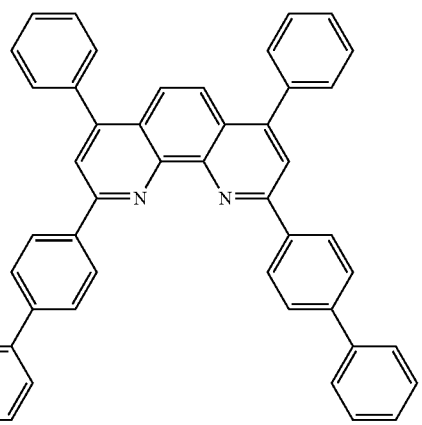
D

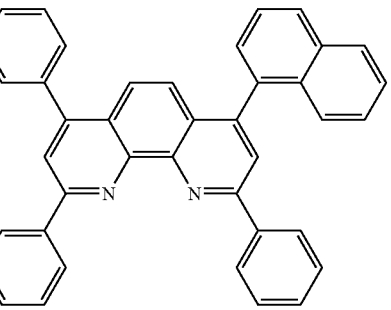
E

Optionally, the P-CGL layer may be a single material film layer, i.e., the P-CGL layer is made of only one material, for example, the P-CGL layer is made of a P-type doped material (PD doped material).

The host material of the P-CGL layer is selected from any one of hole transport materials, such as triphenylamine and biphenyl. The guest material of the P-CGL layer includes a P-type doped material.

Optionally, the P-type doped material of the P-CGL layer is selected from any one of the group consisting of an radialene compound or Tetracyanodimethyl-p-benzoquinone (TCNQ) or tetracyanoquinodimethane (F4TCNQ), which have the following general formula:

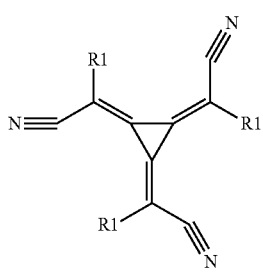

Where R1 is a substituent, and the substituent may be any one of aryl and heteroaryl.

Examples of PD materials are as follows:

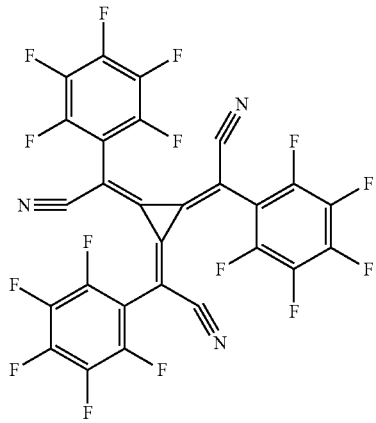

PD-1

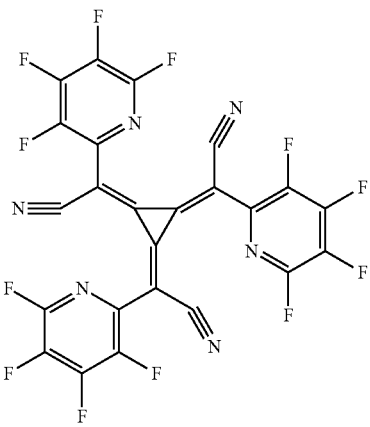

PD-2

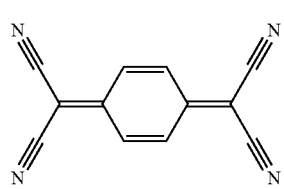

TCNQ

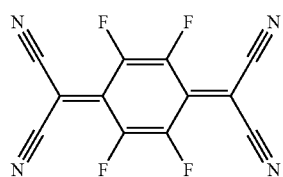

F4TCNQ

Optionally, the P-CGL layer may be a mixed material film layer, that is, the P-CGL layer is made of at least two materials. For example, the P-CGL layer includes a host material and a guest material, and the host material of the P-CGL layer is selected from any one of hole transport materials, such as triphenylamines and biphenyls. The P-type doped material is used as a guest material, and the volume doped concentration of the P-type doped material may be less than or equal to 5%.

Examples of P-CGL host materials are as follows:

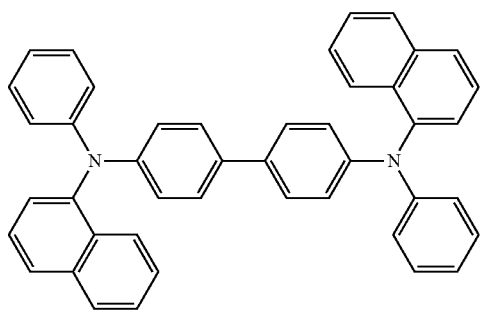

NPB

-continued
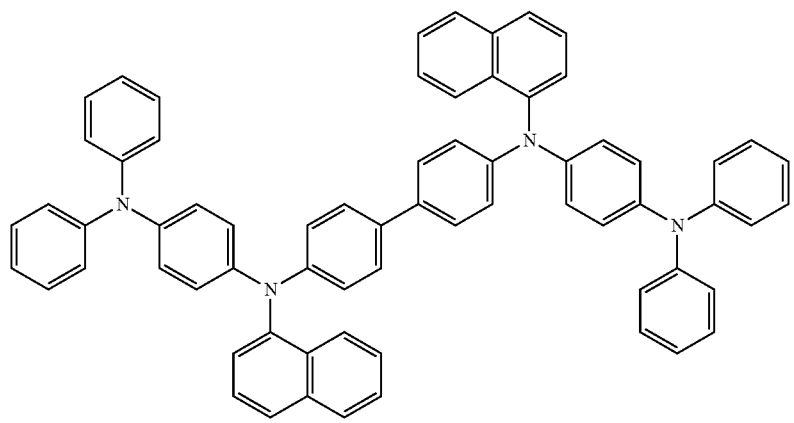
NPB-DPA
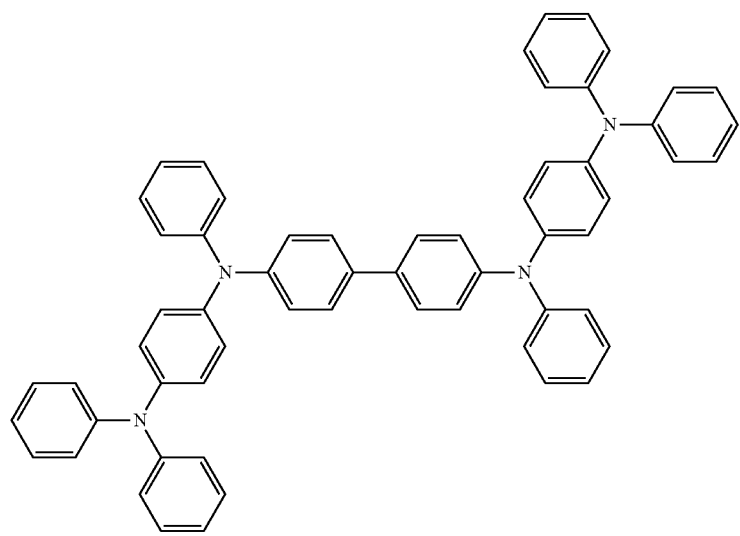
NPNPB
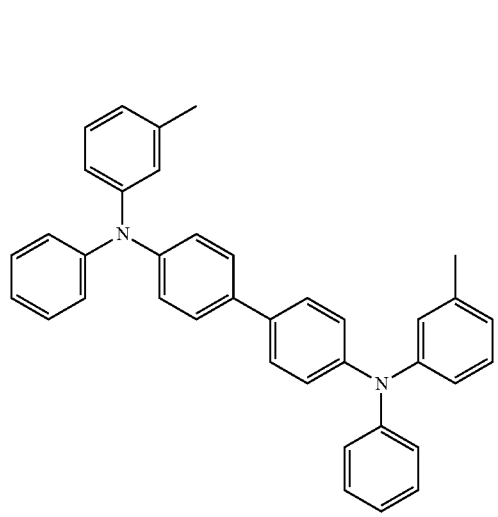
TPD
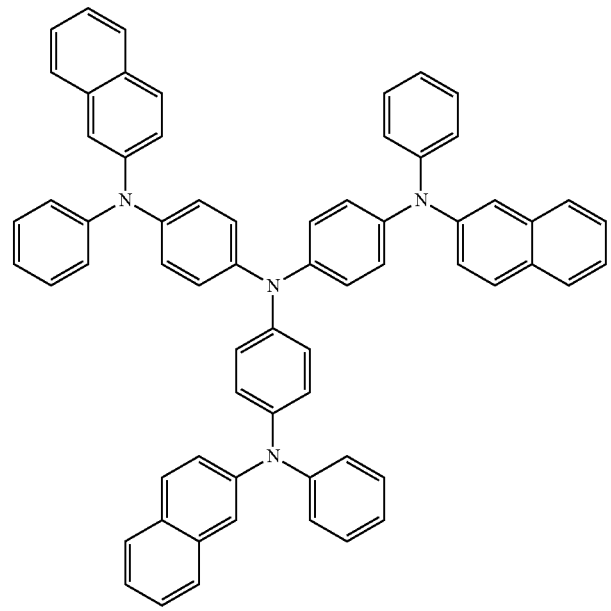
2-TNATA

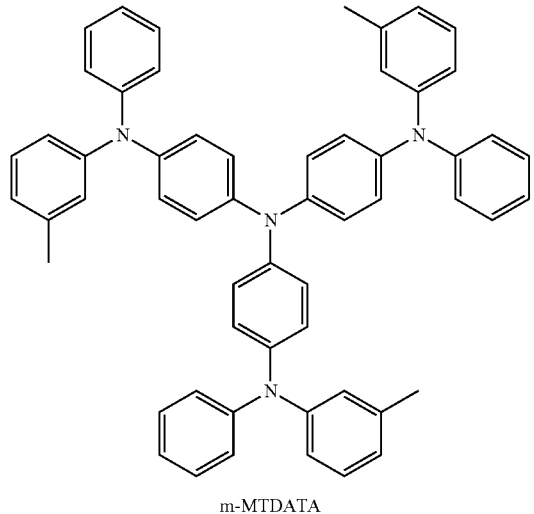

m-MTDATA

Optionally, the P-CGL layer has a thickness in a range from 50 angstroms to 120 angstroms.

In the present disclosure, by employing the above N-CGL layer and P-CGL layer, the P-CGL layer is mainly used for generating charges, the N-CGL layer is mainly used for separating charges, and the host material of the N-CGL layer is enabled to have a lowest unoccupied molecular orbital (LUMO) energy level of less than or equal to −2.9 and a glass transition temperature greater than 130° C., the energy level balance between the N-CGL layer and the P-CGL layer is improved, and the high temperature reliability of the laminated device is effectively improved. The light emitting device may be a bottom emission device with an emission wavelength in a range from 430 nm to 680 nm, or a top emission device with an emission wavelength in a range from 430 nm to 680 nm or a bidirectional emission device with an emission wavelength in a range from 430 nm to 680 nm.

In addition, in the present disclosure, the hole injection layer may be made of a single compound material or a combination of a plurality of compound materials. The hole transport layer/electron blocking layer/hole blocking layer is made of a single compound material. The electron transport layer may be made of a single compound material or a combination of a plurality of compound materials. The first light emitting layer and the second light emitting layer each are made of a combination of a plurality of compound materials, and include, for example, a fluorescent or phosphorescent light emitting material. The above compounds include all organic compounds having the above functions in the related art, which is not particularly limited herein.

According to an aspect of the present disclosure, a display panel is provided. The display panel includes the above light emitting device and a driving circuit for driving the light emitting device. Since the light emitting device capable of improving the high temperature reliability of the laminated device is adopted, the display quality of the display panel with the light emitting device can be improved.

Figure 5:
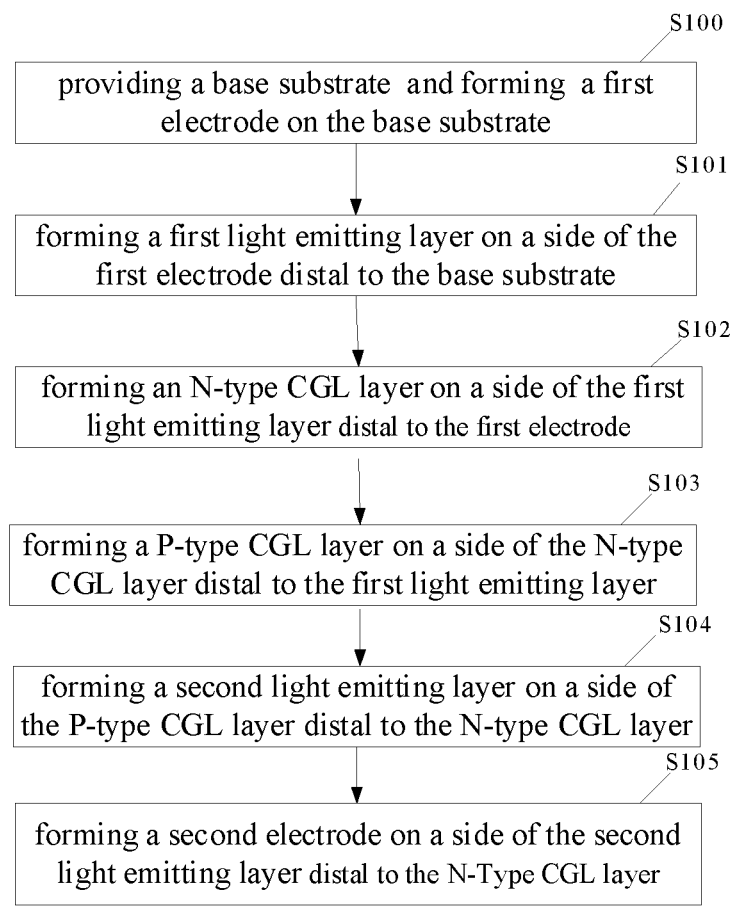
FIG. 5 is a flow chart of a method of manufacturing a light emitting device according to an embodiment of the present disclosure.

According to an aspect of the present disclosure, a method of manufacturing the above light emitting device is provided. As shown in FIG. 5, the method includes the following steps.

In step S100, a base substrate is provided, and a first electrode is formed on the base substrate.

In step S101, a first light emitting layer is formed on a side of the first electrode distal to the base substrate.

In step S102, an N-CGL layer is formed on a side of the first light emitting layer distal to the first electrode.

In step S103, a P-CGL layer is formed on a side of the N-CGL layer distal to the first light emitting layer.

In step S104, a second light emitting layer is formed on a side of the P-CGL layer distal to the N-CGL layer.

In step S105, a second electrode is formed on a side of the second light emitting layer distal to the N-CGL layer.

In the manufacturing method, the lowest unoccupied molecular orbital energy level of the host material adopted when the N-CGL layer is formed is lower than or equal to −2.9, and the glass transition temperature thereof is higher than 130° C. Thus, the light emitting device shown in FIG. 1 can be manufactured.

Optionally, forming the N-CGL layer and the P-CGL layer includes: respectively evaporating a mixed material of the host material and the guest material of the N-CGL layer in a preset volume proportion and a mixed material of the host material and the guest material of the P-CGL layer in a preset volume proportion in a vacuum environment (for example, under a pressure environment of less than $5*10^{-4}$ Pa) to form the corresponding N-CGL layer and the corresponding P-CGL layer.

Optionally, evaporation rates of the host materials of the N-CGL layer and the P-CGL layer are related to the temperature of the vacuum environment and related materials, and evaporation rates of the guest material of the N-CGL layer and the P-CGL layer may be determined by the evaporation rates of the host materials and the volume proportion of the host material to the guest material, for example, the evaporation rate of the host material may be 1 angstrom/sec.

Figure 2:
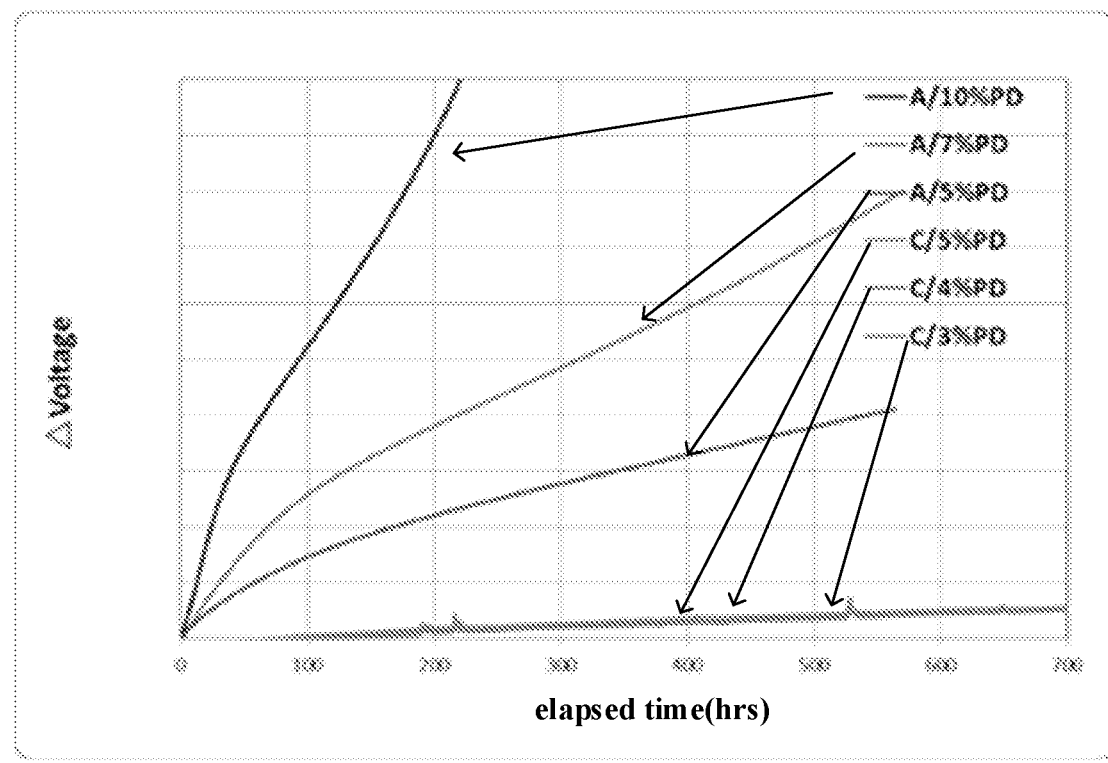
FIG. 2 is a graph illustrating comparison of high temperature experiments for different N-CGL host materials and different concentrations of doped materials according to an embodiment of the present disclosure.
Figure 3:
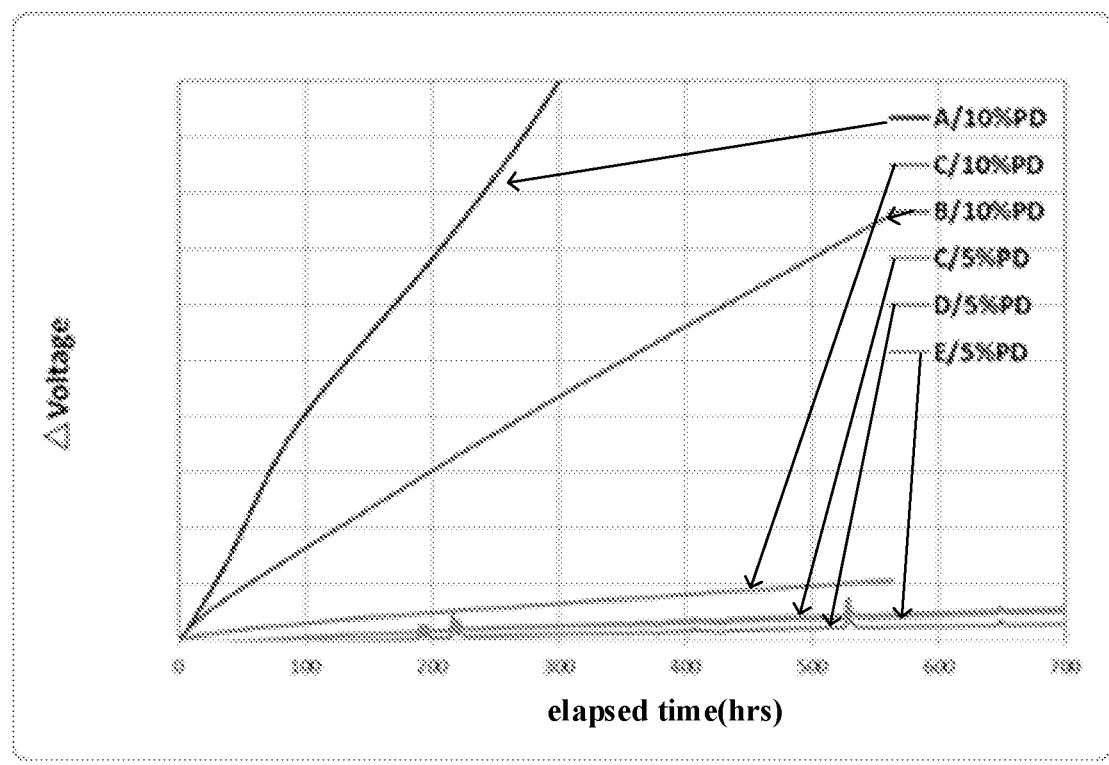
FIG. 3 is a graph illustrating comparison of high temperature experiments for different N-CGL host materials and different concentrations of doped materials according to an embodiment of the present disclosure.

Hereinafter, the light emitting device of the present disclosure will be described by taking ITO (Indium tin oxide)/first light emitting layer/N-CGL layer (200 angstroms)/P-CGL layer (100 angstroms)/second light emitting layer/Al (1000 angstroms) as an example. For the P-CGL layer, NPB is adopted as a host material, the doped concentration of a guest material can be expressed as x % PD, and x is a concentration value. For the N-CGL layer, the host material may be each of the above A, B, C, D and E, and the guest material is 1% Yb. As shown in tables 1 to 3 below, the PD (doped) concentrations are 3%, 4%, 5%, 7%, 10%, respectively; and the host material of the N-CGL is the above: A, B, C, D or E. Graphs illustrating comparison of high temperature experiments for different N-CGL host materials and different concentrations of doped materials are shown in FIGS. 2 to 3.

TABLE 1

| Material | A | B | C | D | E |
|---|---|---|---|---|---|
| LUMO | 2.66 | 2.7 | 2.9 | 2.96 | 2.95 |
| Tg | 120 | 146 | 145 | 161 | 132 |

TABLE 2

| Condition @10 mA/cm2 | A/10% PD | A/7% PD | A/5% PD | C/5% PD | C/4% PD | C/3% PD |
|---|---|---|---|---|---|---|
| Voltage | 100.00% | 100.73% | 102.30% | 100.00% | 101.68% | 105.67% |
| Efficiency | 100.00% | 99.42% | 100.13% | 100.00% | 101.41% | 101.59% |

TABLE 3

| Condition @10 mA/cm2 | A/10% PD | C/10% PD | B/10% PD | C/5% PD | D/5% PD | E/5% PD |
|---|---|---|---|---|---|---|
| Voltage | 100.00% | 99.27% | 98.18% | 100.00% | 102.66% | 103.43% |
| Efficiency | 100.00% | 95.17% | 99.96% | 100.00% | 97.30% | 95.10% |

Table 1 shows the LUMO energy levels and Tg (glass transition temperature) of the above five N-CGL host materials A, B, C, D and E. Table 2 and table 3 show examples of combined experiments for different N-CGL host materials and different P-type doped concentrations (PD concentrations) of P-CGL. As shown in FIG. 2 and FIG. 3, in the test process of the combination examples, as the PD concentration decreases, the difference of the voltages of the light emitting device becomes smaller over time when the light emitting device of the present disclosure operates, so that the voltage increase phenomenon of the light emitting device at high temperature is reduced under the condition that other performances are kept substantially consistent, and the operating performance of the device at high temperature is effectively improved.

The above description is intended to be merely exemplary embodiments of the present disclosure and is not intended to limit the scope of the present disclosure, which is defined by the claims appended hereto.

What is claimed is:

1. A light emitting device, comprising:
a first electrode;
a first light emitting layer on a side of the first electrode;
an N-type charge generation layer on a side of the first light emitting layer distal to the first electrode;
a P-type charge generation layer on a side of the N-type charge generation layer distal to the first light emitting layer;
a second light emitting layer on a side of the P-type charge generation layer distal to the N-type charge generation layer; and
a second electrode on a side of the second light emitting layer distal to the P-type charge generation layer,
wherein the N-type charge generation layer comprises a host material, and the host material of the N-type charge generation layer has a lowest unoccupied molecular orbital energy level less than or equal to −2.9 and a glass transition temperature greater than 130° C.

2. The light emitting device of claim 1, wherein the host material of the N-type charge generation layer comprises an electron transport material having the following general formula:

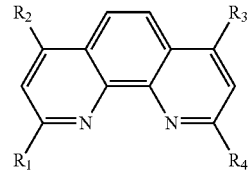

where R1, R2, R3 and R4 are respectively and independently selected from any one of hydrogen, fluorine, chlorine, bromine, alkyl, aryl, heteroalkyl or heteroaryl.

3. The light emitting device of claim 2, wherein the N-type charge generation layer further comprises a guest material, and the guest material of the N-type charge generation layer comprises an N-type doped material.

4. The light emitting device of claim 3, wherein the N-type doped material comprises any one of ytterbium, cesium, or lithium.

5. The light emitting device of claim 4, wherein a volume doped concentration of the guest material of the N-type charge generation layer is in a range from 0.8% to 1.2%.

6. The light emitting device of claim 5, wherein the volume doped concentration of the guest material of the N-type charge generation layer is 1%.

7. The light emitting device of claim 6, wherein the N-type charge generation layer has a thickness in a range from 100 angstroms to 250 angstroms in a direction perpendicular to the first electrode.

8. The light emitting device of claim 7, wherein the P-type charge generation layer comprises a host material and a guest material, and the host material of the P-type charge generation layer is selected from any one of hole transport materials of triphenylamines and biphenylamines.

9. The light emitting device of claim 8, wherein the guest material of the P-type charge generation layer comprises a P-type doped material.

10. The light emitting device of claim 9, wherein the P-type doped material is any one selected from a radialene compound, tetracyanodimethyl-p-benzoquinone, and tetracyanoquinodimethane which have the following general formula:

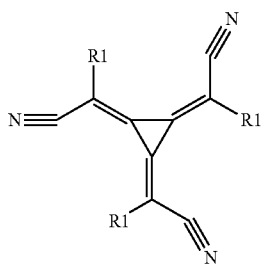

where R1 is selected from any one of aryl and heteroaryl.

11. The light emitting device of claim 10, wherein a volume doped concentration of the P-type doped material is less than or equal to 5%.

12. The light emitting device of claim 11, wherein the P-type charge generation layer has a thickness in a range from 50 angstroms to 120 angstroms in the direction perpendicular to the first electrode.

13. The light emitting device of claim 1, wherein a color of light emitted by the first light emitting layer is the same as or different from a color of light emitted by the second light emitting layer.

14. The light emitting device of claim 13, further comprising the following layers which are sequentially provided in a direction away from the first electrode:
  a hole injection layer on a side of the first electrode;
  a first hole transport layer on a side of the hole injection layer distal to the first electrode;
  a first electron blocking layer on a side of the first hole transport layer distal to the first hole injecting layer, and the first light emitting layer being on a side of the first electron blocking layer distal to the first hole transport layer; and
  a first hole blocking layer on a side of the first light emitting layer distal to the first electron blocking layer, and the N-type charge generation layer being on a side of the first hole blocking layer distal to the first light emitting layer.

15. The light emitting device of claim 13, further comprising the following layers which are sequentially provided in a direction away from the P-type charge generation layer:
  a second hole transport layer on a side of the P-type charge generation layer distal to the N-type charge generation layer;
  a second electron blocking layer on a side of the second hole transport layer distal to the P-type charge generation layer, and the second light emitting layer being on a side of the second electron blocking layer distal to the second hole transport layer;
  a second hole blocking layer on a side of the second light emitting layer distal to the second electron blocking layer;
  a electron transport layer on a side of the second hole blocking layer distal to the second light emitting layer; and
  an electron injection layer on a side of the electron transport layer distal to the second hole blocking layer.

16. A display panel, comprising the light emitting device of claim 1 and a driving circuit for driving the light emitting device.

17. A method of manufacturing the light emitting device of claim 1, comprising:
  providing a base substrate, and forming a first electrode on the base substrate;
  forming a first light emitting layer on a side of the first electrode distal to the base substrate;
  forming an N-type charge generation layer on a side of the first light emitting layer distal to the first electrode, such that a host material of the N-type charge generation layer has a lowest unoccupied molecular orbital energy level less than or equal to −2.9 and a glass transition temperature greater than 130° C.;
  forming a P-type charge generation layer on a side of the N-type charge generation layer distal to the first light emitting layer;
  forming a second light emitting layer on a side of the P-type charge generation layer distal to the N-type charge generation layer; and
  forming a second electrode on a side of the second light emitting layer distal to the P-type charge generation layer.

18. The method of claim 17, wherein the host material of the N-type charge generation layer comprises an electron transport material having the following general formula:

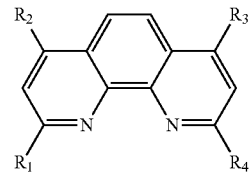

where R1, R2, R3 and R4 are respectively and independently selected from any one of hydrogen, fluorine, chlorine, bromine, alkyl, aryl, heteroalkyl or heteroaryl.

19. The method of claim 18, wherein the N-type charge generation layer further comprises a guest material, the guest material of the N-type charge generation layer comprises an N-type doped material, and the N-type doped material comprises any one of ytterbium, cesium, or lithium.

20. The method of claim 19, wherein the guest material of the N-type charge generating layer has a volume doped concentration in a range from 0.8% to 1.2%.

* * * * *